(12) United States Patent
Jung et al.

(10) Patent No.: US 7,428,959 B2
(45) Date of Patent: Sep. 30, 2008

(54) SUBSTRATE TRANSFERRING APPARATUS

(75) Inventors: Jun-Mo Jung, Hwaseong (KR); Jung-Soo Lee, Hwaseong (KR)

(73) Assignee: SFA Engineering Corp., Kyungsangnamdo (KR)

( * ) Notice: Subject to any disclaimer, the term of this patent is extended or adjusted under 35 U.S.C. 154(b) by 444 days.

(21) Appl. No.: 11/337,971

(22) Filed: Jan. 23, 2006

(65) Prior Publication Data
US 2006/0177297 A1 Aug. 10, 2006

(30) Foreign Application Priority Data
Jan. 26, 2005 (KR) .................... 10-2005-0007162
Mar. 23, 2005 (KR) .................... 10-2005-0024001

(51) Int. Cl.
*B65G 47/22* (2006.01)
(52) U.S. Cl. .................... 198/493; 414/676; 406/88
(58) Field of Classification Search ................ 198/493, 198/817; 414/676; 193/35 R; 406/88, 95; 65/25.1, 25.2, 182.2
See application file for complete search history.

(56) References Cited

U.S. PATENT DOCUMENTS

| 3,473,910 | A | * | 10/1969 | Wilde et al. ................ 65/182.2 |
| 5,628,605 | A | * | 5/1997 | Miyoshi ................ 414/331.01 |
| 6,736,588 | B1 | * | 5/2004 | Baldwin et al. ............. 414/676 |
| 6,810,784 | B1 | | 11/2004 | Cunningham |
| 7,037,063 | B2 | * | 5/2006 | Park et al. .................... 414/676 |
| 2005/0063791 | A1 | * | 3/2005 | Chang et sl. ................ 198/493 |

* cited by examiner

*Primary Examiner*—James R Bidwell
(74) *Attorney, Agent, or Firm*—Daly, Crowley, Mofford & Durkee, LLP

(57) ABSTRACT

Disclosed herein is a substrate transferring apparatus. The apparatus comprises air injection modules, which serve to float a substrate, and can be independently attached to or detached from the substrate transferring apparatus. Thus, even if any one of the air injection modules is damaged, the substrate is prevented from falling because other air injection modules serve to continuously float the substrate. Furthermore, with such a construction, the air injection modules have an advantage in view of maintenance.

16 Claims, 6 Drawing Sheets

SUBSTRATE TRANSFERRING APPARATUS

CROSS REFERENCE TO RELATED APPLICATION

The present application claims priority to Korean Patent Application No. 10-2005-0007162 filed on Jan. 26, 2005, and to Korean Patent Application No. 10-2005-0024001 filed on Mar. 23, 2005, both of which are incorporated herein by reference.

BACKGROUND OF THE INVENTION

1. Field of the Invention

The present invention relates to a substrate transferring apparatus for transferring plate-shaped substrates.

2. Description of the Related Art

Recent developments in information technology have resulted in a wide use of information display devices, and continuously increased necessity thereof. Various information display devices are known in the art ranging from conventional CRT monitors to flat panel displays such as liquid crystal displays (LCD), plasma display panels (PDP), organic light emitting devices (OLED) and the like. In particular, the LCD has been increased in importance of application in view of its utility. Specifically, due to advantages such as miniaturization, light weight, low power consumption, the LCD has been increased in its application as a replacement which can overcome disadvantages of the conventional display device such as CRT monitors.

During a process for manufacturing such a flat display device, a thin glass substrate having a thickness of about 0.7 □ is treated. Specifically, while transferring a thin and wide glass substrate to respective processing stages, various processes are performed. Meanwhile, since the flat display device requires a significantly high precision, even a minute scar can have a detrimental influence on the quality of the flat display device. Thus, when manufacturing the flat display device, it is very important in view of quality management of the products to prevent damage from being formed on the surface thereof during transfer of the substrate as well as during other processes during manufacture of the flat display device.

In this regard, as for a substrate transferring apparatus used for the process of manufacturing the flat display device, a substrate transferring apparatus which is not brought into direct contact with a surface of a substrate in order to prevent damage of the substrate have been mainly developed. In particular, a substrate transferring apparatus designed to transfer the substrate in a floated state with air is mainly used in the art. More specifically, the substrate transferring apparatus operates in such a way that rollers of the apparatus are brought into contact with very narrow portions at both sides of the substrate, and rotate to transfer the substrate while air injection nozzles inject air perpendicular to a substantial area of the substrate including a central region thereof in order to float the substrate, thereby allowing a wide substrate to be stably transferred.

However, since such an air-floating type substrate transferring apparatus requires a pump to supply a highly compressed air for the flotation of the substrate, and a pipe to connect the pump with a body of the substrate transferring apparatus, the substrate transferring apparatus has a complicated structure, causing an increase in manufacturing costs. In particular, as the surface area of the flat display device has recently been increased, the requirement for a large capacity pump has been also increased together with difficulty in the management of the pipe.

In addition, a substrate transferring apparatus which can be commonly used for transfer of substrates having various sizes via an appropriate adjustment of the apparatus according to the sizes of the substrates is urgently needed in the art.

SUMMARY OF THE INVENTION

The present invention has been made to solve the above problems, and it is an object of the present invention to provide a substrate transferring apparatus appropriate for efficient transfer of a large area substrate.

In accordance with one aspect of the present invention, the above and other objects can be accomplished by the provision of a substrate transferring apparatus for transferring a substrate mounted thereon in a horizontal direction, comprising: a pair of transfer roller sets parallelly separated a predetermined distance from each other, and rotating in a state of contacting both sides of the substrate to move the substrate in the horizontal direction; a plurality of air injection modules disposed between the pair of transfer roller sets, and separated a predetermined distance from each other to inject air upwardly to a central region of the substrate and to float the substrate, each air injection module being detachably attached to the substrate transferring apparatus, and movable in its position.

In accordance with another aspect of the present invention, there is provided a substrate transferring apparatus for transferring a substrate held in a slanted position in a horizontal direction, comprising: a substrate moving part being able to rotate, and contacting a lower side of the slanted substrate to move the substrate in the horizontal direction; and a plurality of air injection modules provided in a diagonal direction with respect to the substrate moving part to inject air toward the substrate in order to float the substrate in the slanted state.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Preferred embodiments of the present invention will be described in detail with reference to the accompanying drawings.

Embodiment 1

Figure 1:
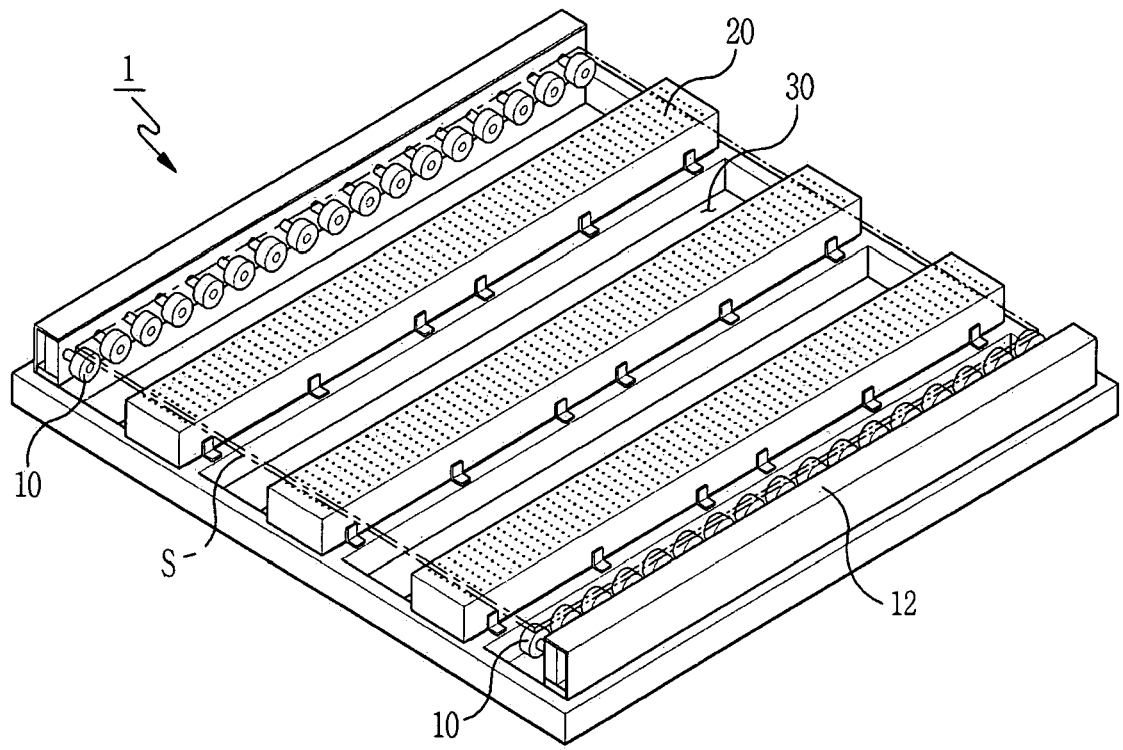
FIG. 1 is a perspective view illustrating a substrate transferring apparatus in accordance with a first embodiment of the present invention.

As shown in FIG. 1, a substrate transferring apparatus 1 according to a first embodiment comprises a pair of transfer roller sets 10; air injection modules 20; and substrate loading and unloading paths 30.

The pair of transfer roller sets 10 is brought into direct contact with both ends of a substrate S, and rotates to transfer the substrate S in a horizontal direction. In order to allow the substrate to be transferred by the pair of transfer roller sets 10 in a state wherein very narrow portions at both sides of the substrate contact the pair of transfer roller sets 10, the transfer roller sets 10 are spaced as far apart as possible from each other in the horizontal direction. At this time, the transfer roller sets 10 are rotated by separate driving units (not shown). Here, the driving units are partitioned from the pair of transfer roller sets 10 in order to prevent particles, which can be created during rotation of the transfer roller sets 10, from spreading towards the substrate and contaminating the substrate. Specifically, as shown in FIG. 1, each of the driving units is positioned in a closed space of an outer box 12, and is partitioned from an associated transfer roller set which contacts the substrate S. The outer box 12 may be formed with an air vent (not shown) through which internal air can be sucked, and discharged to an outside.

Figure 2:
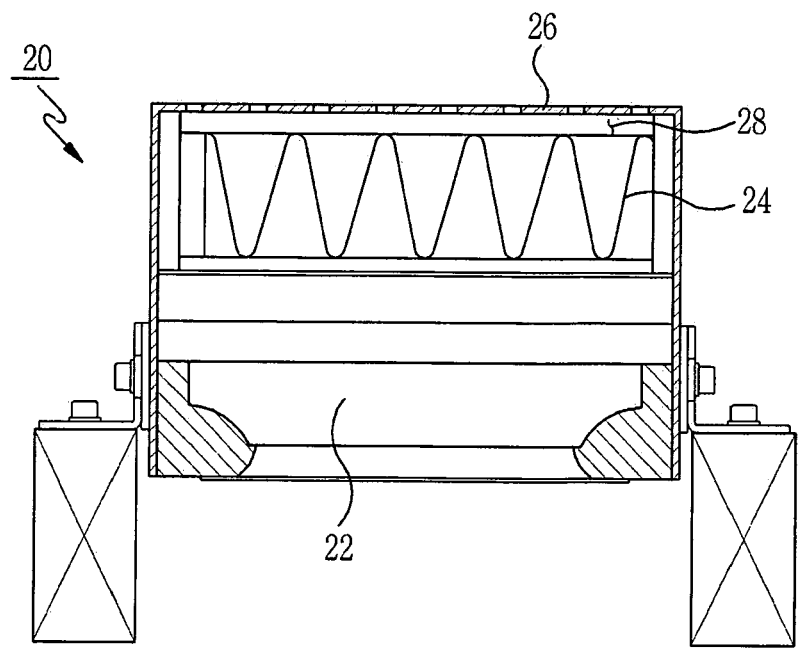
FIG. 2 is a cross-sectional view illustrating the construction of an air injection module of the substrate transferring apparatus according to the first embodiment.

The air injection modules 20 serve to inject air perpendicular to a central region of the substrate, which is being transferred by the substrate transferring apparatus 1, so as to float the substrate. As shown in FIG. 2, each of the air injection modules 20 comprises blowing fans 22, a filter member 24, a porous plate 26, and a buffering space 28. The blowing fans 22 serve to blow air perpendicular to the substrate S. Each air injection module 20 comprises a plurality of blowing fans 22 which are separated a predetermined distance from each other, and horizontally disposed therein. Preferably, each of the blowing fans 22 inject air upwardly from a central portion of the blowing fan 22 while injecting air diagonally from an outer periphery of the blowing fan 22, such that the air can be uniformly injected to the substrate from every portion of each air injection module 20.

The filter member 24 serves to filter foreign substances from air blown upwardly by the blowing fans 22 in order to purify the air. Thus, the filter member 24 is positioned above the blowing fans 22, and has a construction that sufficiently removes foreign substances in the air while ensuring sufficient passage of the air so as not to lower air pressure generated by the blowing fans 22. Preferably, the filter member 24 has a wider cross section than each of the blowing fans 20, and is positioned to face an entire surface of each air injection module 20.

The porous plate 26 allows air passing through the filter member 24 to be uniformly injected upwardly. As shown in FIG. 2, the porous plate 26 is a plate which has a number of through holes formed, and spaced a predetermined space from each other thereon. Here, the though holes having a small diameter are preferably formed as many as possible on the plate such that the air can be uniformly injected to the entire surface of the substrate.

The buffering space 28 allows air passing through the filter member 24 to stay a predetermined period therein in order to uniformly distribute the air below the entire surface of the air injection module 20, thereby allowing the air to be injected with a predetermined pressure from the air injection module 20. That is, when the air passing through the filter member 24 in a highly compressed state by the blowing fans 22 enters the buffering space 28, the buffering space 28 servers to allow the air to stay with a predetermined pressure therein before being injected through the porous plate 26, so that the air is uniformly distributed therein, and then injected with the predetermined pressure. If the substrate transferring apparatus does not comprise such a buffering space 28, air is directly blown toward the substrate by the air injection modules 20, such that high-pressure air is blown to the central region of the substrate, and low-pressure air is blown to other regions thereof, causing some portions of the substrate to float relatively high, and other portions of the substrate to float relatively low. There occurs a problem in that the substrate is bent during transfer of the substrate. Accordingly, it is very important to determine the volume of the buffering space 28. If the buffering space 28 has an excessively large volume, there occurs a problem in that a vortex flow is generated in the buffering space 28. On the contrary, if the buffering space 28 has an excessively small volume, there occurs a problem in that air is not sufficiently spread.

Figure 3:
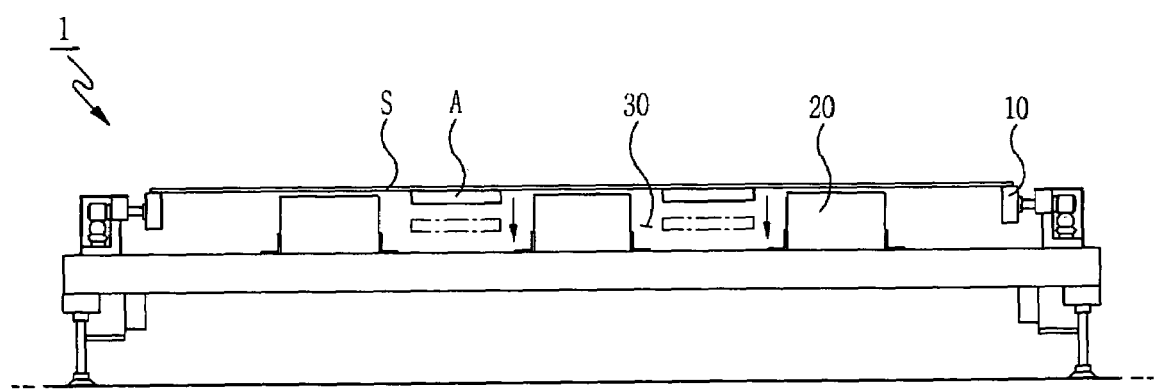
FIG. 3 is view illustrating a process for loading a substrate on the substrate transferring apparatus according to the first embodiment.

The substrate transferring apparatus 1 according to this embodiment comprises a plurality of air injection modules 20. In other words, as shown in FIG. 1, the plural air injection modules 20 are separated a predetermined distance from each other between the pair of transfer roller sets. At this time, a larger area substrate results in an increase in the number of air injection modules 20, whereas a smaller area substrate results in a decrease in the number of air injection modules 20. In addition, according to the embodiment, when the substrate transferring apparatus 1 comprises the plurality of air injection modules 20, the air injection modules 20 are spaced the predetermined distance from each other. As a result, predetermined spaces are defined between the air injection modules 20. According to this embodiment, these spaces are used as substrate loading/unloading paths 30 which can be used for loading or unloading the substrate on the substrate transferring apparatus. As shown in FIG. 3, each of the substrate loading/unloading paths 30 allows a robot arm A of a substrate transferring robot (not shown) placed at the outside to enter the space, and to be lifted or lowered therein when loading or unloading the substrate on the substrate transferring apparatus 1. That is, after the robot arm A enters an associated substrate loading/unloading path 30 with the substrate S mounted on the robot arm A, the robot arm S is lowered therein, delivers the substrate S to the transfer roller sets 10, and is then withdrawn to an original position. Unloading operation of the substrate S by the robot arm A is performed by reverse procedures.

According to this embodiment, the substrate transferring apparatus further comprises a buffering member 40 in each loading/unloading path 30. The buffering member 40 serves to prevent the substrate from colliding against the air injection modules 20 by supporting the lower surface of the substrate S when the substrate S floated by the air injection modules 20 falls. Thus, the buffering member 40 can be lifted or lowered so as to avoid interference with the robot arm A. The buffering member 40 is placed at a height between an upper surface of the air injection modules 20 and the lower surface of the floated substrate during transfer of the substrate S.

At this time, according to the present embodiment, the buffering member 40 comprises a substrate contact portion 42, an impact absorbing portion 44, and a lifting member. The substrate contact portion 42 constitutes an upper portion of the buffering member 40, and is brought into direct contact with the lower surface of the substrate S. The substrate contact portion 42 has a spherical shape in order to minimize a contact area with the substrate S. With the spherical shape of the substrate contact portion 42, the substrate contact portion 42 has a point contact with the substrate S, thereby providing a merit of minimizing the contact area with the substrate S. Preferably, the substrate contact portion 42 is made of a stretchable material in order to absorb impact applied to the substrate S when contacting the substrate S.

The lifting member serves to lift or lower the substrate contact portion 42. For this purpose, the lifting member is coupled to a lower portion of the substrate contact portion 42 to drive the substrate contact portion 42 up and down.

Figure 4:
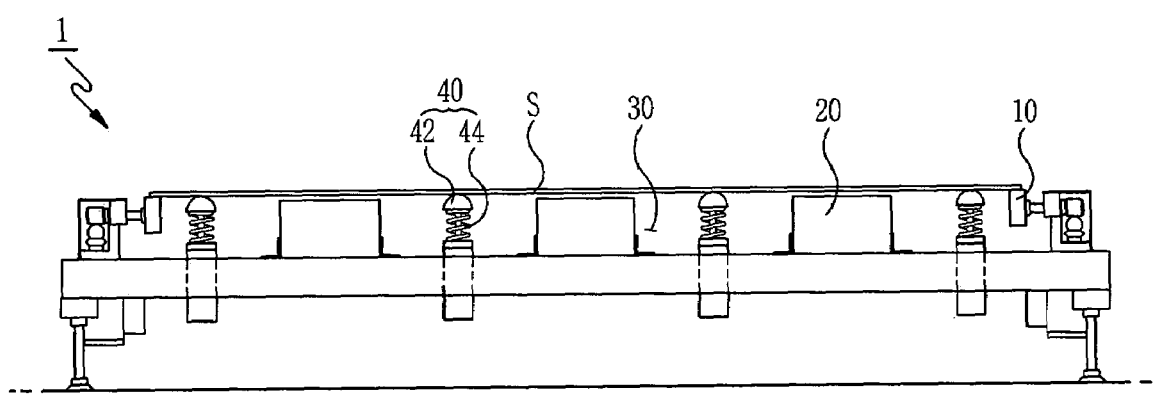
FIG. 4 is a view illustrating a buffering member of the substrate transferring apparatus according to the first embodiment.

The impact absorbing portion 44 is inserted to a connecting shaft which connects the substrate contact portion 42 and the lifting member, and serves to absorb the impact applied to the substrate contact portion 42. That is, as shown in FIG. 4, the impact absorbing portion 44 is realized by a resilient member inserted to the connecting shaft between the substrate contact portion 42 and the lifting member to maintain the substrate contact portion 42 at a predetermined height.

Meanwhile, preferably, each of the air injection modules 20 is detachably attached to the substrate transferring apparatus 1, and is movable in its position in the substrate transferring apparatus. With such a construction of allowing the air injection modules 20 to be independently detached from or attached to the substrate transferring apparatus 1, the substrate transferring apparatus has an advantage in that the number air injection modules 20 can be adjusted according to the size of the substrate S.

Figure 5:
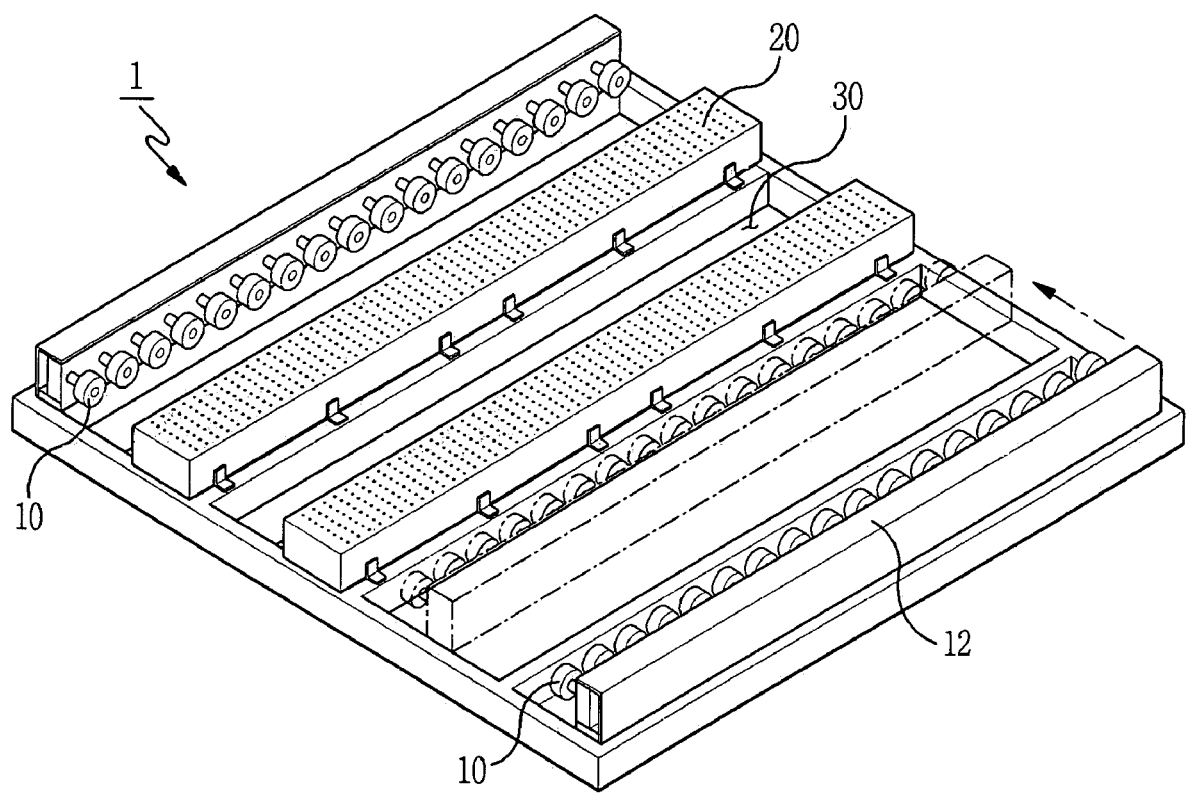
FIG. 5 is a view illustrating operation of a pair of transfer roller sets of the substrate transferring apparatus according to the first embodiment.

In addition, preferably, the distance between the transfer roller sets 10 is adjustable. With this construction, when one of the air injection modules 20 is detached from the apparatus, one of the transfer roller sets 10 is moved towards the other transfer roller set 10, as shown in FIG. 5, thereby narrowing the distance between the transfer roller sets 10. With such a construction of allowing the distance between the transfer roller sets 10 to be adjusted, the substrate transferring apparatus can be variously adapted according to the size of the substrate transferred thereby, so that the apparatus of the invention can be commonly applied to substrates having different sizes.

Embodiment 2

Figure 6:
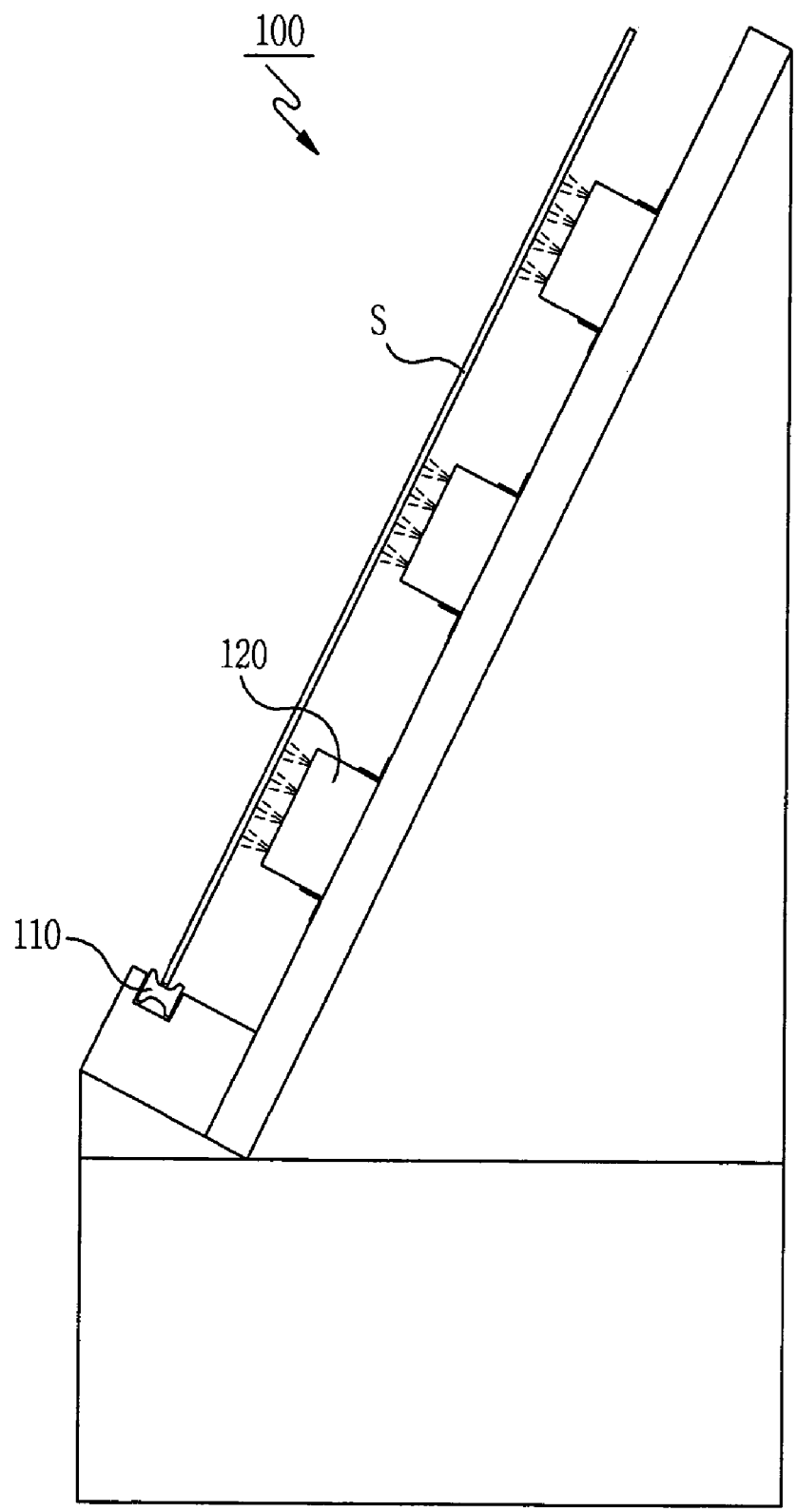
FIG. 6 is a cross-sectional view illustrating a substrate transferring apparatus in accordance with a second embodiment of the present invention.
Figure 7:
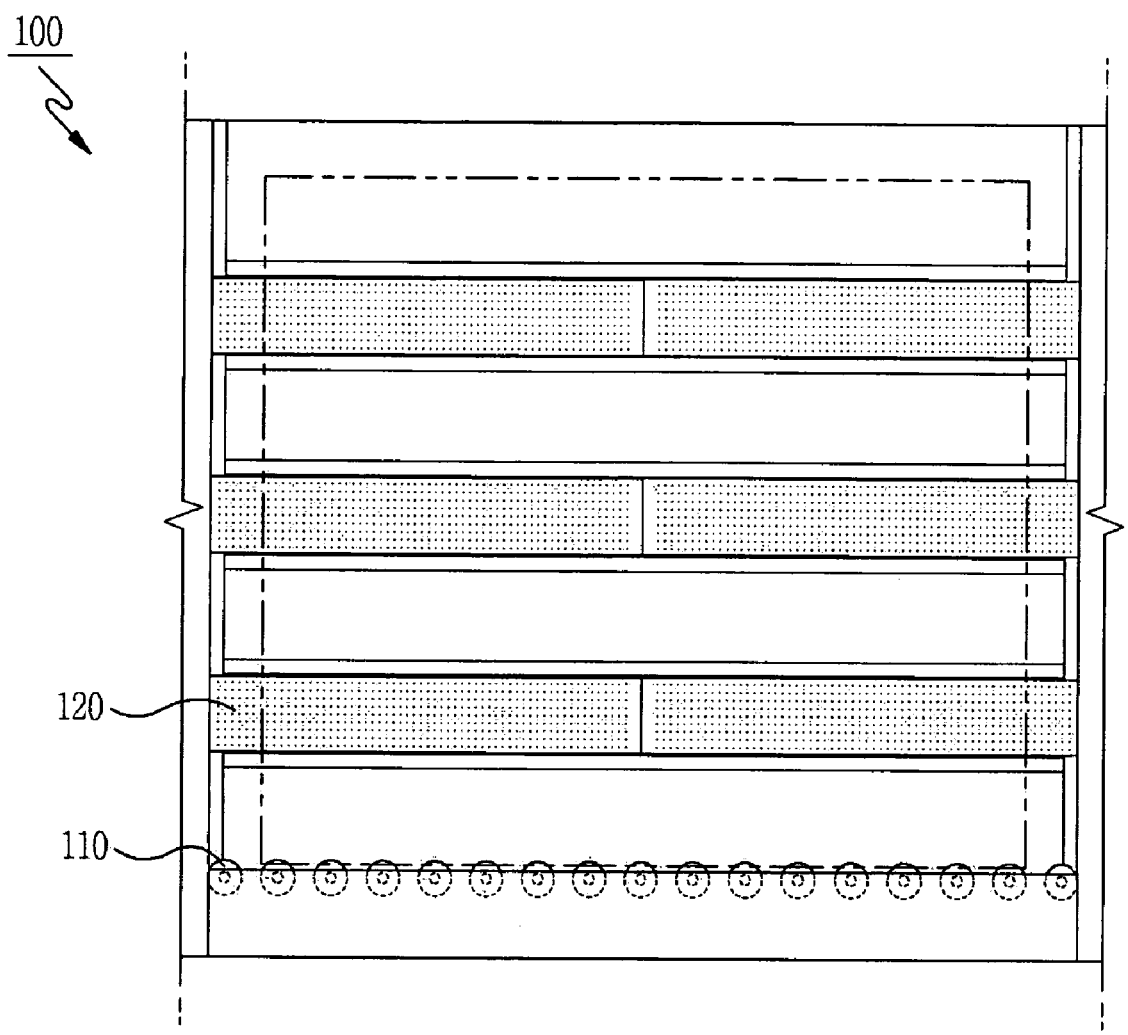
FIG. 7 is a front view illustrating the substrate transferred by a substrate moving part of the transferring apparatus according to the second embodiment.

As shown in FIG. 6, a substrate transferring apparatus 100 according to a second embodiment comprises a substrate moving part 110; and air injection modules 120. According to the second embodiment, the substrate is held in a slated position rather than a horizontal state, and transferred in order to reduce a foot print occupied by the substrate transferring apparatus 100. Here, the substrate is transferred in a state of being slanted at a predetermined angle instead of being stood at a right angle in order to ensure more stable transfer of the substrate. While the substrate is transferred in the state of being slanted at the predetermined angle, it is supported by the air injection modules 120 positioned at one side of the substrate. This allows the substrate to be stably transferred without falling, and reduces the space occupied by the substrate transferring apparatus 100 in a clean room.

The substrate moving part 110 serves to move the substrate in the horizontal direction while holding the substrate in the slanted position. According to the second embodiment, the substrate moving part 100 comprises a plurality of rollers, which contact a lower side of the substrate S standing at an angle, and move the substrate S. Here, according to the second embodiment, in order to prevent the lower side of the substrate S from being separated from a contact surface with the rollers as shown in FIG. 6, a periphery of the rollers extend outwardly.

Next, the air injection modules 120 are provided in a diagonal direction with respect to the substrate moving part 110, as shown in FIG. 6, and horizontally guide the substrate S while maintaining the slant of the substrate. In other words, the air injection modules 120 serve to guide the substrate in the horizontal direction while supporting the substrate in a slightly slanted state with respect to the vertical direction so as not to fall. At this time, according to the second embodiment, each of the air injection modules 120 is also detachably attached to the substrate transferring apparatus 100, and movable in its position. The air injection modules 120 of the second embodiment have the same construction as that of the first embodiment, and thus repetitious description thereof will be omitted hereinafter.

The substrate transferring apparatus 100 according to this embodiment comprises a plurality of air injection modules 120. In other words, as shown in FIG. 6, the plural air injection modules 120 are separated a predetermined distance from each other in the diagonal direction with respect to the substrate moving part 110. At this time, a larger area substrate results in an increase in the number of rows of the air injection modules 120, whereas a smaller area substrate results in a decrease in the number of rows of the air injection modules 120. In addition, according to the present embodiment, when arranging the air injection modules 120 in plural rows on the substrate transferring apparatus 100, the rows are separated a predetermined distance from each other, thereby defining preliminary paths 130 between the respective rows. These preliminary paths 130 may have various utility. First of all, the preliminary paths 130 can be used as substrate loading/unloading paths for loading or unloading the substrate on the substrate transferring apparatus 100.

Figure 8:
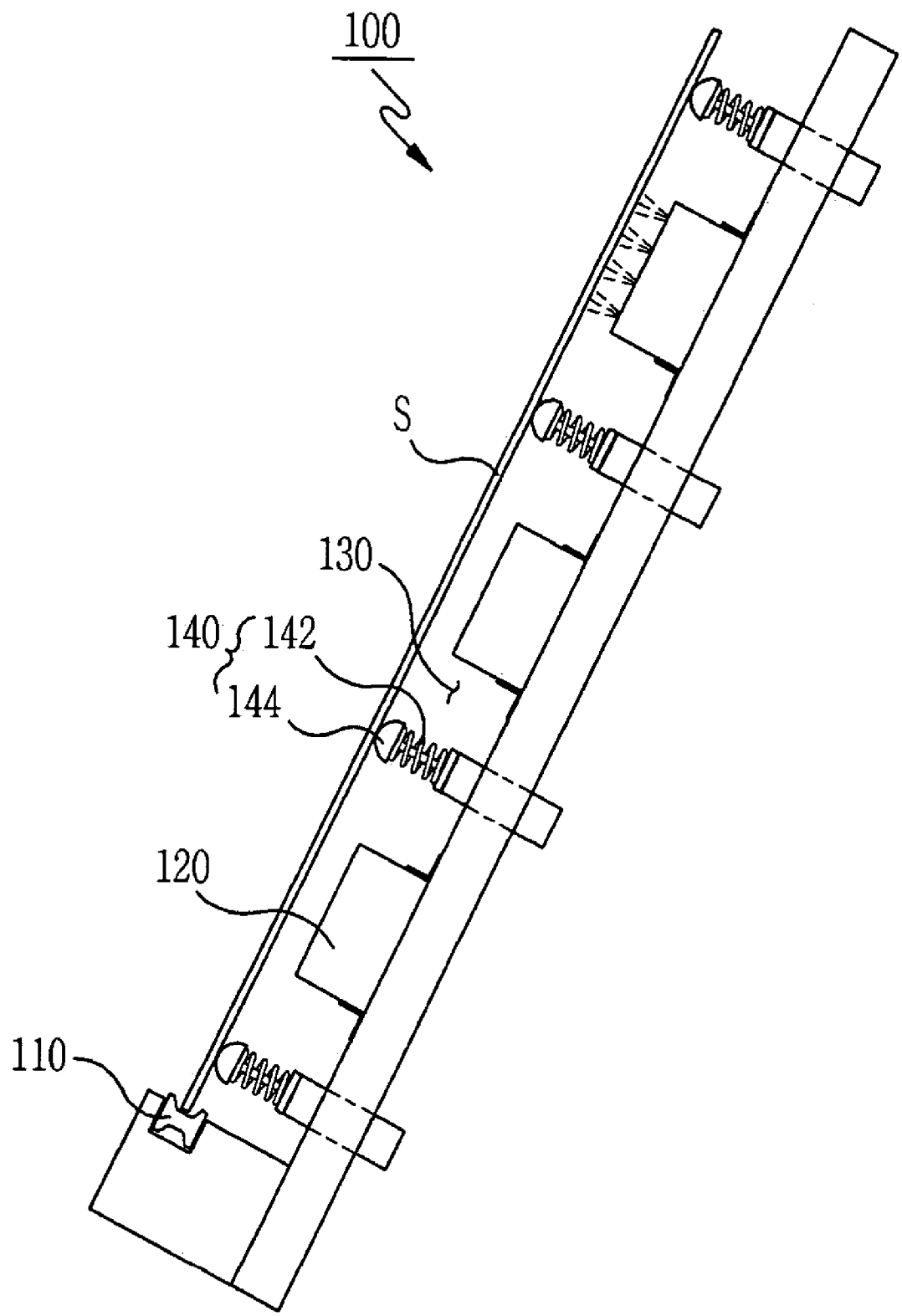
FIG. 8 is a partial cross-sectional view illustrating the substrate transferring apparatus according to the second embodiment.

In addition, as shown in FIG. 8, each of the preliminary paths 130 can be used as a space for positioning a buffering member 140. In other words, the buffering member 140 is positioned in each preliminary path 130, and can be lifted or lowered with respect to the substrate while supporting the substrate above the air injection modules 120. The buffering members 140 serve to prevent the substrate from colliding against the air injection modules 120 by supporting a lower surface of the substrate S when the substrate S floated by the air injection modules 120 falls. Thus, the buffering member 140 can be lifted or lowered with respect to the substrate in order to allow the preliminary paths 130 to be used for other utilities, and when the preliminary paths 130 are used for other utilities, the buffering member 40 is placed, and waits at a height between an upper surface of the air injection modules 120 and the lower surface of the floated substrate.

At this time, since the buffering member 140 of the second embodiment has the same construction as that of the first embodiment, repetitious description thereof will be omitted hereinafter.

Meanwhile, preferably, each of the air injection modules 120 according to the second embodiment is detachably attached to the substrate transferring apparatus 100. With such a construction allowing the air injection modules 20 to be independently detached from or attached to the substrate transferring apparatus 100, there is an advantage in that the number air injection modules can be adjusted according to the size of the substrate.

As apparent from the above description, one of the advantageous effects of the present invention is that a large area substrate can be transferred without additional compressing pumps or pipes, and without damage of the substrate.

In addition, according to the invention, the substrate transferring apparatus can be commonly applied to various substrates having different sizes by changing the construction thereof according to the size of the substrate to be transferred thereby.

In addition, according to the invention, the air injection modules can be detachably attached to the substrate transferring apparatus, so that, even if any one of the air injection modules is damaged, the substrate is prevented from falling because other air injection modules continue to float the substrate. Furthermore, with such a construction, the air injection modules provide an advantage in view of maintenance thereof.

In addition, the substrate transferring apparatus can stably transfer the substrate in a slightly slanted state rather than in an upright state while supporting the substrate via the air injection method, thereby preventing the substrate from being damaged during transfer of the substrate.

It should be understood that the embodiments and the accompanying drawings have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A substrate transferring apparatus for transferring a substrate mounted thereon in a horizontal direction, comprising:
   a pair of transfer roller sets parallelly separated a predetermined distance from each other, and rotating in a state of contacting both sides of the substrate to move the substrate in the horizontal direction;
   a plurality of air injection modules disposed between the pair of transfer roller sets, and separated a predetermined distance from each other to inject air upwardly to a central region of the substrate, and to float the substrate, each air injection module being detachably attached to the substrate transferring apparatus, and movable in its position.

2. The apparatus as set forth in claim 1, wherein each of the air injection modules comprises:
   a blowing fan to blow air upwardly to the substrate;
   a filter member provided above the blowing fan to filter foreign substances from the air blown by the blowing fan;
   a porous plate separated a predetermined distance above the filter member to allow the air passing through the filter member to be uniformly injected upwardly; and
   a buffering space closed between the filter member and the porous plate to spread the air passing through the filter member therein.

3. The apparatus as set forth in claim 1, further comprising: buffering members provided between the air injection modules, and being lifted or lowered therebetween such that the buffering members are lifted above the air injection modules, and support the substrate when the substrate falls.

4. The apparatus as set forth in claim 3, wherein each of the buffering members comprises a substrate contact portion contacting the substrate, and an impact absorbing portion coupled to a lower portion of the substrate contact portion to absorb impact applied to the substrate contact portion.

5. The apparatus as set forth in claim 4, wherein the substrate contact portion is made of a stretchable material.

6. The apparatus as set forth in claim 5, wherein the substrate contact portion has a spherical shape.

7. The apparatus as set forth in claim 6, wherein the transfer roller sets are adjustable in a distance therebetween.

8. A substrate transferring apparatus for transferring a substrate held in a slanted position in a horizontal direction, comprising:
   a substrate moving part being rotatable, and contacting a lower side of the slanted substrate to move the substrate in the horizontal direction; and
   a plurality of air injection modules provided in a diagonal direction with respect to the substrate moving part to inject air toward the substrate and to float the substrate in the slanted position.

9. The apparatus as set forth in claim 8, wherein the substrate moving part comprises a plurality of rollers separated a predetermined distance from each other.

10. The apparatus as set forth in claim 9, wherein each of the air injection modules is detachably attached to the substrate transferring apparatus, and movable in position.

11. The apparatus as set forth in claim 10, wherein each of the air injection modules comprises:
    a blowing fan to blow air upwardly toward the substrate;
    a filter member provided above the blowing fan to filter foreign substances from the air blown by the blowing fan;
    a porous plate separated a predetermined distance above the filter member to allow the air passing through the filter member to be uniformly injected upwardly; and
    a buffering space closed between the filter member and the porous plate to spread the air passing through the filter member therein.

12. The apparatus as set forth in claim 11, wherein the air injection modules are provided in plural rows separated a predetermined distance from each other to define preliminary paths between the respective rows.

13. The apparatus as set forth in claim 12, further comprising: buffering members provided between the air injection modules, and being lifted or lowered with respect to the substrate in each of the preliminary paths such that the buffering members are lifted above the air injection modules, and support the substrate when the substrate falls.

14. The apparatus as set forth in claim 13, wherein the buffering member comprises a substrate contact portion contacting the substrate, an impact absorbing portion coupled to a lower portion of the substrate contact portion to absorb impact applied to the substrate contact portion, and a lifting member coupled to a lower portion of the impact absorbing portion to lift or lower the substrate contact portion and the impact absorbing portion.

15. The apparatus as set forth in claim 14, wherein the substrate contact portion is made of a stretchable material.

16. The apparatus as set forth in claim 15, wherein the substrate contact portion has a spherical shape.

* * * * *